(12) United States Patent
Beerling et al.

(10) Patent No.: US 6,592,205 B2
(45) Date of Patent: Jul. 15, 2003

(54) INKJET PRINTHEAD FOR WIDE AREA PRINTING

(75) Inventors: Timothy Beerling, Berkeley, CA (US); James W Pearson, Corvallis, OR (US); Antonio Cruz-Uribe, Corvallis, OR (US); Melissa D. Boyd, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 9 days.

(21) Appl. No.: 09/924,879

(22) Filed: Aug. 7, 2001

(65) Prior Publication Data

US 2002/0018101 A1 Feb. 14, 2002

Related U.S. Application Data

(63) Continuation-in-part of application No. 08/959,376, filed on Oct. 28, 1997, now Pat. No. 6,123,410, and a division of application No. 09/070,864, filed on Apr. 30, 1998, now Pat. No. 6,325,488.

(51) Int. Cl.[7] .............................. B41J 2/155; B41J 2/14; B41J 2/16
(52) U.S. Cl. .......................................... 347/42; 347/50
(58) Field of Search ............................... 347/42, 50, 58

(56) References Cited

U.S. PATENT DOCUMENTS 6,099,109 A * 8/2000 Kumoro ..................... 347/50

\* cited by examiner

*Primary Examiner*—John Barlow
*Assistant Examiner*—Michael S Brooke
(74) *Attorney, Agent, or Firm*—Raymond A. Jenski (57) ABSTRACT

A printhead is formed from a plurality of ink ejectors mounted on an inner surface of a rigid substrate while protruding through holes provided in the substrate. Electrical contact is provided on a surface of the ink ejectors common with the ink ejecting nozzles thereby avoiding vias to another surface. The rigid substrate provides a conducting layer on its inner surface such that the ink ejectors may be connected thereto with solder reflow techniques.

11 Claims, 12 Drawing Sheets

INKJET PRINTHEAD FOR WIDE AREA PRINTING

This invention is a continuation-in-part of U.S. patent application Ser. No. 08/959,376, now U.S. Pat. No. 6,123,410, "Scalable Wide-Array Inkjet Printhead and Method for Fabricating Same", filed on behalf of Timothy E. Beerling, et al. On Oct. 28, 1997 and a divisional of U.S. patent application Ser. No. 09/070,864, now U.S. Pat. No. 6,325,488, filed on Apr. 30, 1998. The present invention is generally related to a print head for an inkjet printer and is more particularly related to a print head and its method of manufacture suitable for a large area printing.

BACKGROUND OF THE INVENTION

Inkjet printing technology has become widely known and is often implemented using a thermal ink propulsion mechanism. Such technology forms characters and images on a medium, such as paper, by expelling drops of ink in a controlled fashion so that the drops land on the medium. In its simplest form, the printer can be understood as a working combination of a mechanism for moving and placing the medium in a position such that the ink drops can be placed on the medium, a print cartridge which controls the flow of ink and selectively expels drops of ink to the medium, and appropriate controlling hardware and software to position the medium and expel droplets so that a desired graphic is formed on the medium.

A conventional print cartridge for an inkjet printer comprises an ink containment device and an ink ejection assembly which selectively heats and expels ink drops in a controlled fashion. An alternative ink ejection apparatus for other than thermal inkjet printers uses mechanical propulsion techniques such as piezo-electric drivers to impart momentum to the ink. For thermal inkjet printers, the ink ejection assembly typically includes a laminate structure comprising a semiconductor or insulator substrate capped with a plate or surface permeated by orifices or nozzles arranged in a pattern beneficial to the deposition of ink on a medium. In thermal inkjet printers, the heating and expulsion mechanism consists of a plurality of heater resistors formed on the semiconductor, each heater resistor associated with one of the nozzles in the nozzle plate. Each of the heater resistors is coupled to the controlling hardware and software of the printer such that each of the resistors may be independently energized to quickly vaporize a portion of ink and expel a drop of ink from the nozzle. Ink is stored in an ink reservoir in the print cartridge, in most implementations, and is typically loaded into a firing chamber which is disposed about the heater resistor. The pressure created following the ink expulsion causes ink to be removed from the ink reservoir through ink manifolds and ink conduits and into the ink firing chambers.

Figure 1A:
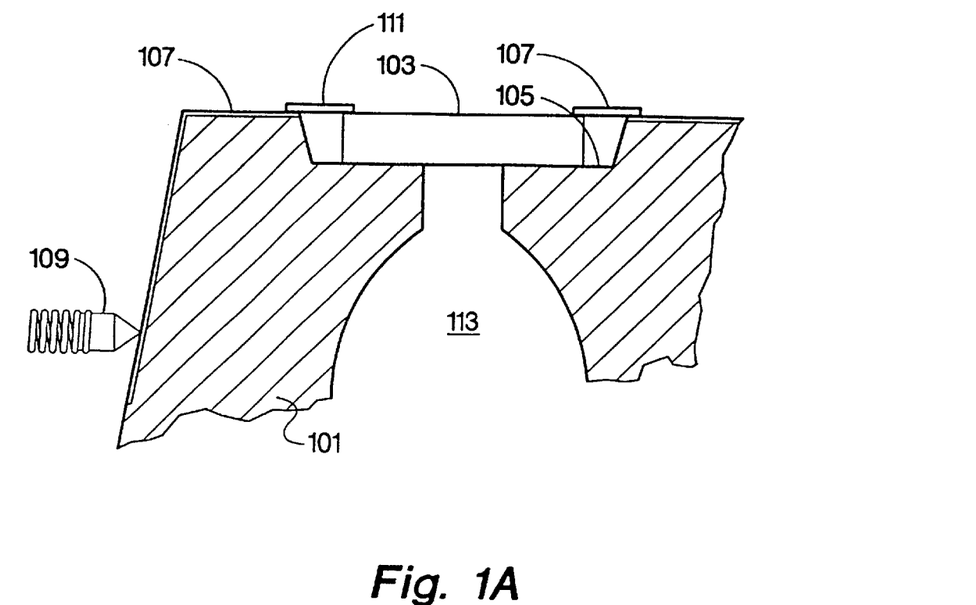
FIGS. 1A and 1B illustrate a cross section through a portion (the "nose") of the print cartridge which faces a medium to be printed upon.

Currently, the most widely used thermal inkjet printers utilize a relatively small printhead (approximately 5 mm×10 mm) that is mounted on a protruding "nose" of the ink cartridge, thereby being positioned in close proximity to the medium to be printed upon. Such an arrangement is shown diagrammatically in FIG. 1A. Here, a cross section of the nose of the cartridge body 101 shows a printhead 103 affixed to the body 101 in a well 105 having a depth that is approximately equal to the thickness of the printhead 103. A flexible electronics circuit commonly known as a tape automated bonding (TAB) circuit 107 is conventionally affixed to that portion of the body 101 which is directly opposite the medium to be printed upon. The TAB circuit 107 is typically wrapped around one of the other surfaces of the nose so that an electrical connection may be made to the other controlling portions of the printer. This is illustrated diagrammatically with point contact 109. Electrical connection between the TAB circuit 107 and the printhead 103 is typically made using a beam lead technology (as illustrated with beam lead 111) but may also be accomplished with wire bonding techniques. In order to prevent electrical shorts due to ink and to provide mechanical protection, an encapsulating substance (not shown) is typically placed over the wire bonding or beam lead area. Ink is provided to the printhead from a reservoir of ink by ink ducts 113 within the print cartridge.

Figure 1B:
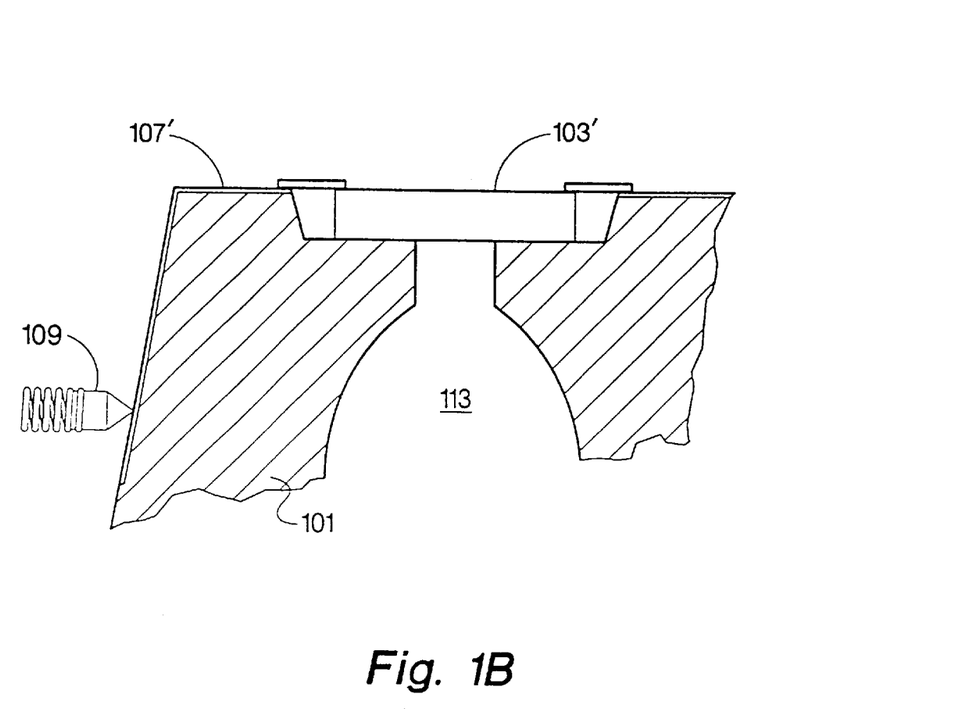

An alternative arrangement which has come into recent use is illustrated in FIG. 1B. This arrangement utilizes the TAB circuit 107' as an nozzle plate as well as it conventional electrical interconnect purpose. The nozzles are laser ablated or otherwise created in the flexible polymer TAB circuit tape and the TAB circuit is stretched over the remainder of the printhead 103' in such a way that ink is ejected from the TAB circuit nozzles. As described relative to FIG. 1A, the TAB circuit is wrapped around the side of the body 101 and electrical connection is made by way of a contact 109. Ink is brought to the printhead 103' by ink ducts 113 in the print cartridge.

These techniques have demonstrably proven their value in many successful products. The extension of these technologies to a print cartridge which is expected to print a wide print swath, perhaps the width of an entire medium page, exposes problems which require solutions before these technologies can be used for a wide area print cartridge.

If one desires to create a print cartridge which is capable of printing a wide swath in a single pass (for example a 5 cm to 20+cm swath), or as much as a 20 cm swath, a large number of printing nozzles must be positioned near the medium to be printed upon. It is conceivable that a printhead having thousands of nozzles could be so positioned, but the reliable fabrication of such a large number of nozzles in a single printhead is not economically feasible. Accordingly, a smaller number of nozzles in an ejecting mechanism can be economically produced and a plurality of these ejection mechanisms can be ganged together in a single printhead to effectively obtain a large number of nozzles. Coordinating such a plurality of ink ejection devices requires a high degree of registration of nozzles of separate ink ejectors as well as a high degree of planarity between the ejecting surfaces of the ink ejectors so that the drops ejected from one ink ejector are properly placed on the medium relative to the drops ejected from another ink ejector.

Accordingly, it is desirable to create a printhead employing a plurality of ink ejection apparatus in a wide array configuration. Such an array should provide a reliable fluidic and electrical interconnect between the print head and the plurality of ink ejection apparatus as well as a high degree of registration between the ink ejection apparatus with a corresponding reduction of misplaced ink drops.

SUMMARY OF THE INVENTION

The present invention encompasses a printhead for an inkjet printer which employs an essentially rigid substrate having a first surface and a second surface. A conducting layer is disposed at least partially on the second surface and at least one opening in the essentially rigid substrate extends from the first surface to the second surface. An ink ejection assembly has a first surface and a second surface and includes an ejector. This ejector imparts momentum to ink within the ink ejection assembly. A nozzle plate forms a first portion of the first surface of the ink ejection assembly and has a nozzle through which ink is ejected. A conducting layer forms a second portion of the first surface of the ink ejection assembly so that the ejector may be energized. An ink feed channel is disposed in the second surface of the ink ejection assembly. The ink ejection assembly is disposed in the at least one opening and in contact with the essentially rigid substrate such that the nozzle plate and the first surface of the essentially rigid substrate are in a predetermined relationship relative to one another and the conducting layer of the ink ejection assembly is connected to the conducting layer of the essentially rigid substrate.

DESCRIPTION OF THE PREFERRED EMBODIMENTS

Figure 2:
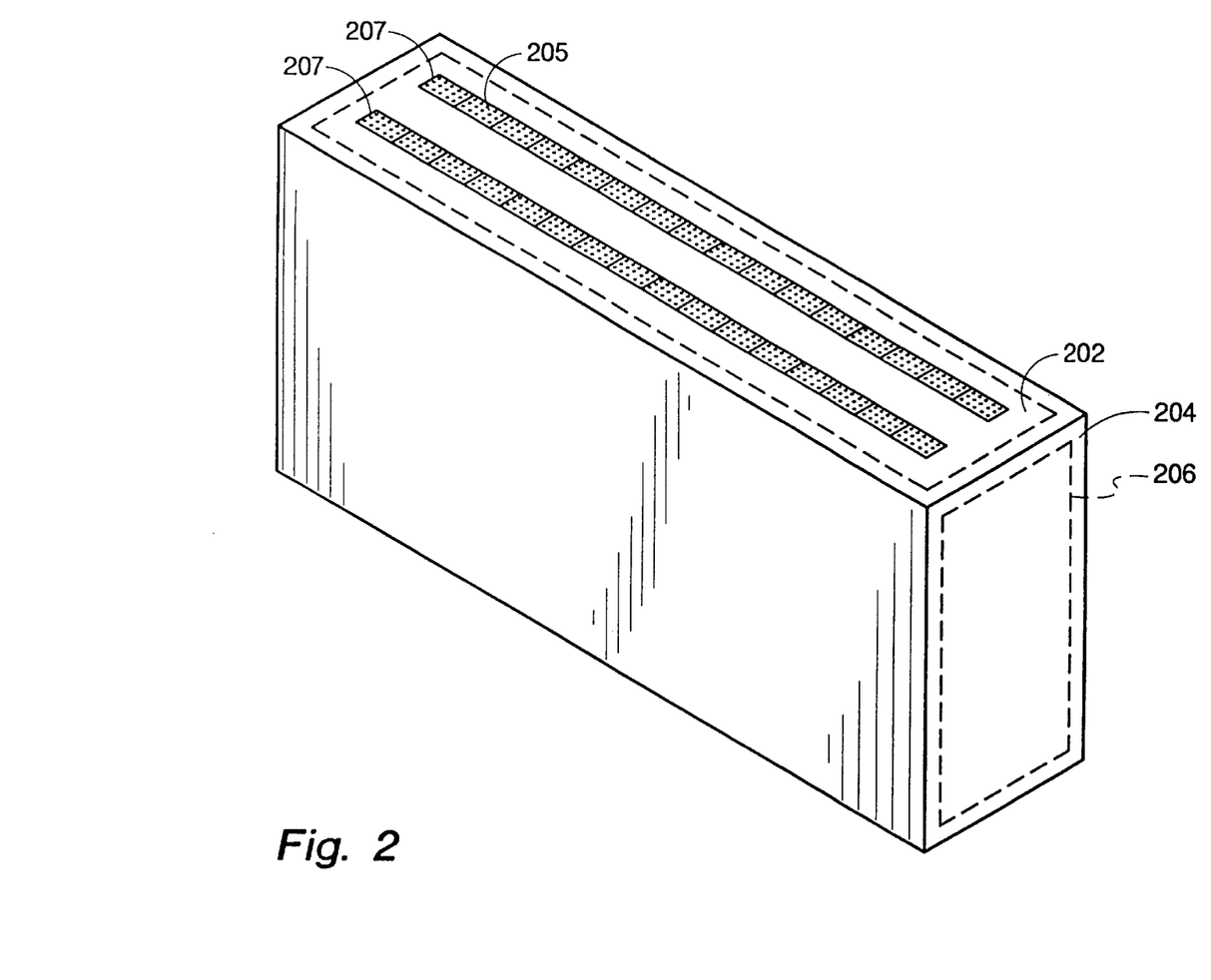
FIG. 2 is an isometric illustration of a print cartridge which may employ the present invention.

FIG. 2 illustrates a wide array inkjet cartridge which includes a wide array printhead 202 disposed on a nose of a cartridge body 204. The cartridge body 204 serves as a housing for ink to which the printhead 202 is affixed. Such affixing will place an ink ejection assembly 205 either external to the nose of the cartridge pen body 204 or internal to the nose of the cartridge body 204. The cartridge body 204 typically includes an internal chamber 206 which serves as a local ink reservoir. In various embodiments the reservoir is a replaceable reservoir or a refillable reservoir or may be coupled to an external reservoir (not shown) which supplies ink to the local reservoir 206. In yet another embodiment the local reservoir is non-refillable.

Figure 3A:
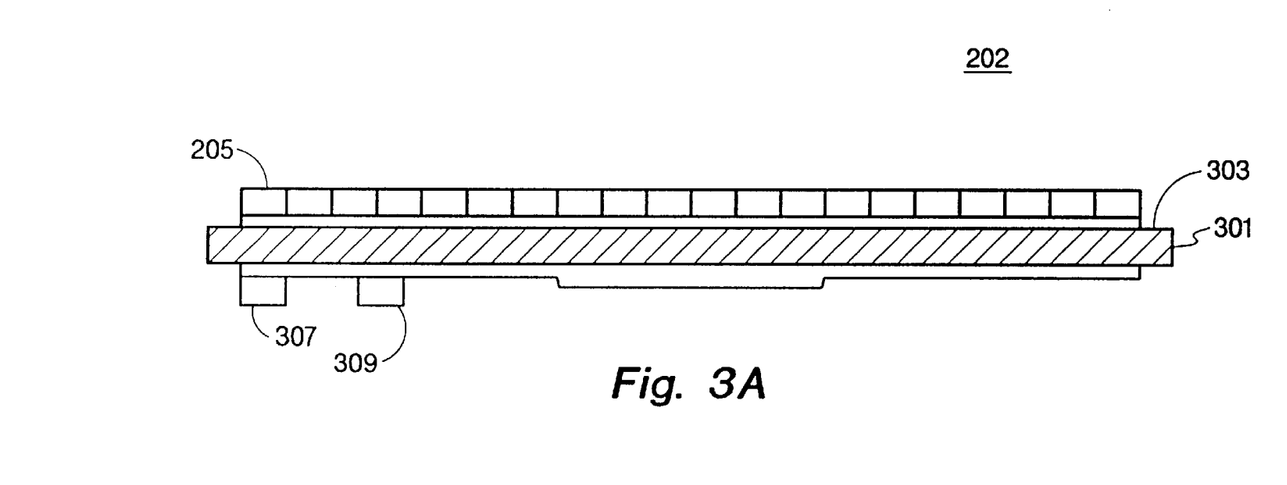
FIGS. 3A and 3B illustrate a cross section through a printhead.
Figure 3B:
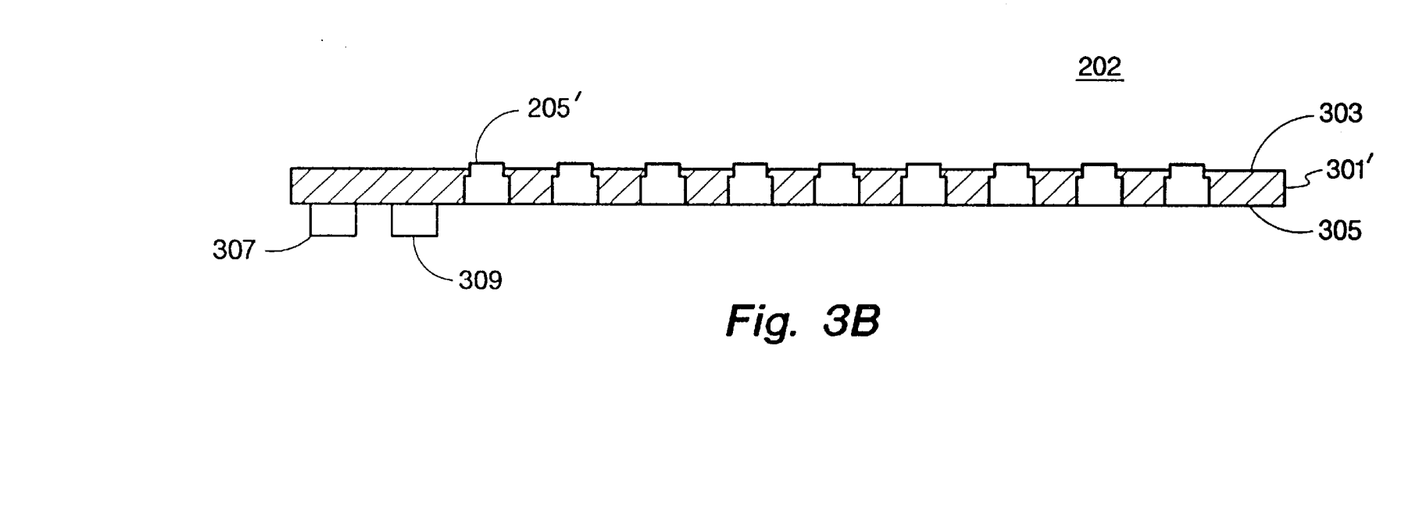

Referring to FIGS. 2, 3A, and 3B, the printhead 202 includes a plurality of ink ejector assemblies 205, which in the preferred embodiment comprise semiconductor dice and associated nozzle plates, mounted on an external surface 303 of a carrier substrate 301. Or, as shown in FIG. 3B, mounted on an inside surface 305 of the carrier substrate 301'. Each one of the ink ejecting apparatus is disposed in one or more rows 207 (see FIG. 2). In one embodiment, the ink ejectors are placed end-to-end with the respective rows of ink ejectors being aligned relative to one another. In an alternative embodiment which employs ink ejection apparatus 205' mounted on an inside surface 305 of the carrier substrate 301' and extending through to the external surface 303 such as that shown in FIG. 3B, the ink ejectors are mounted in two or more rows of alternating placement of ink ejectors. Using this implementation, ink ejectors are coordinated in registration and expulsion such that a solid swath is printed on a medium which translates in a direction perpendicular to the rows of ink ejectors.

The carrier substrate 301 is made of silicon or a multilayer ceramic material such as is used in forming hybrid multi-chip modules, or other similar rigid material having a thermal coefficient of expansion compatible with silicon or other semiconductor chip materials. The carrier substrate 301 is machinable or otherwise formable to allow formation of ink slots, when desirable, channels, and other openings such as those which would accommodate mounting of ink ejectors from the inside surface 305. It is also desirable that the carrier substrate 301 be able to receive solder and adhesives, provide interconnect vias and layers, and be able to receive mounting of integrated circuits.

Figure 4:
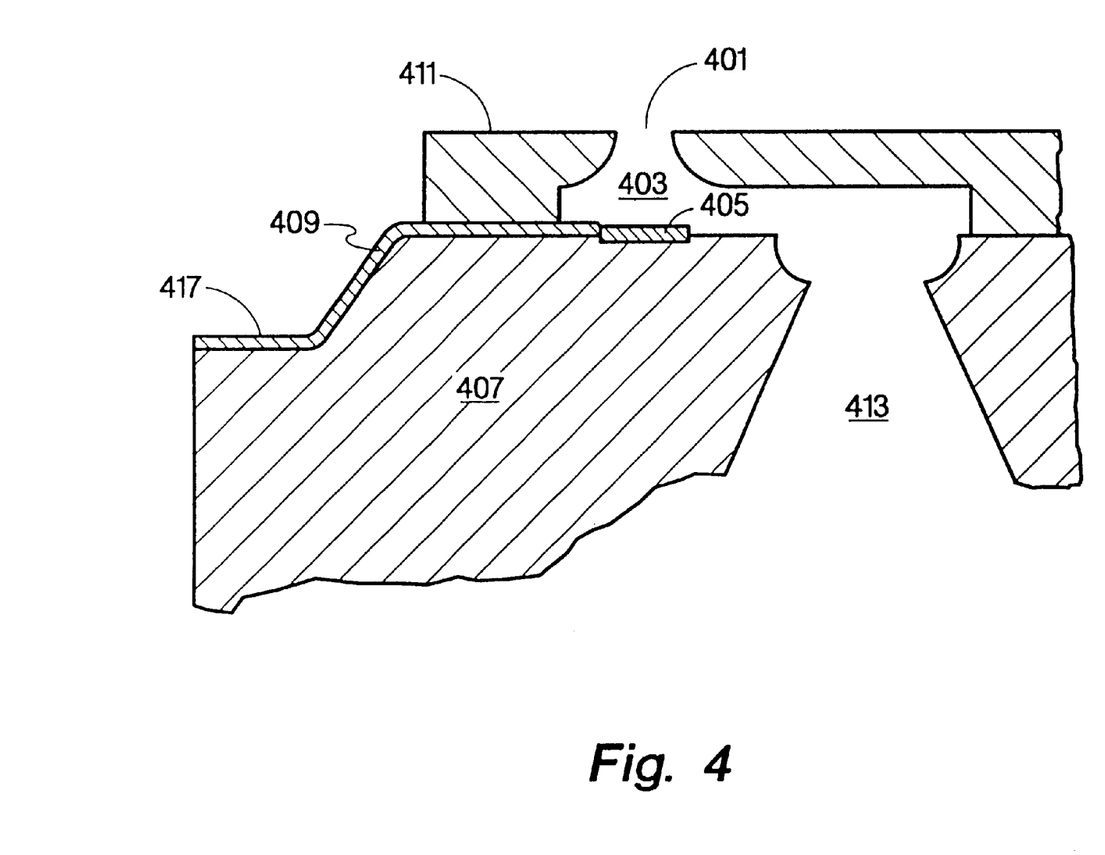
FIG. 4 illustrates a cross section of an ink ejection apparatus which may be employed in the present invention.

A cross-section through one of the ink ejection assemblies 205' is shown in FIG. 4. A nozzle 401 opens to a portion of an external surface of the ink ejector and allows the expulsion of ink from the nozzle to the surface of the medium to be printed upon. In a preferred embodiment, ink which is resident in a firing chamber 403 is heated to the point of vaporization by a heater resistor 405 (which acts as an ejector in the thermal inkjet embodiment of the invention) and expelled from the firing chamber 403 through the nozzle 401. Heater resistor 405 is disposed on and in a semiconductor substrate 407 and is provided electrical energy by way of electrical conductors, such as conducting layer 409 disposed on another portion, shoulder 417 of the external surface of the semiconductor substrate 407. Conducting layer 409 then runs beneath the nozzle plate (and is no longer exposed to the external surface) to electrically couple to the ejector. Of course, an electrical circuit must be completed in order to energize the heater resistor 405, but for clarity of drawing a full complement of electrical connections has been omitted. A nozzle plate 411 forms the inner top surface, and in some instances the inner side surfaces, of the firing chamber 403 of the ink ejection apparatus. In some implementations, the nozzle plate is joined to a photochemical polymer, which may be patterned and etched to define various ink passageways and ink firing chambers. In other implementations this polymer barrier layer is not used and the intricate passageways and firing chambers are formed in the nozzle plate itself. In any event, an ink feed channel 413 opens to a second surface on an opposite side of the ink ejection assembly from the first, external, surface and is coupled, there, to a manifold or duct, thence to a source of ink. The ink feed channel 413 provides ink for each firing chamber to which it is coupled.

In one embodiment one or more of the ink ejectors is a fully integrated thermal (FIT) printhead constructed of an integrated silicon substrate with its associated thin film structure (encompassing the heater resistor, the electrical energy carrying conductors, and appropriate passivation and cavitation barrier layers) and the nozzle plate (including the ink ejecting nozzles). In an exemplary embodiment, the silicon substrate is approximately 675 microns thick. Glass, carbon, ceramic or a stable polymer are used in place of the silicon in alternative embodiments. The thin film structure is formed by one or more passivation or insulation layers of silicon dioxide, silicon carbide, silicon nitride, tantalum, polysilicon glass, or other suitable material. The conductive layer is formed by aluminum, gold, tantalum-aluminum, or another metal or metal alloy. In an exemplary embodiment, the thin-film structure is approximately 4 microns thick. Depending upon the desired performance, the nozzle plate and the nozzle bores are adjusted for optimum performance and are conventionally in the 10 to 40 micron range. In an exemplary embodiment the heater resistor is approximately square with a length on each side of approximately 10 to 30 microns.

Figure 5:
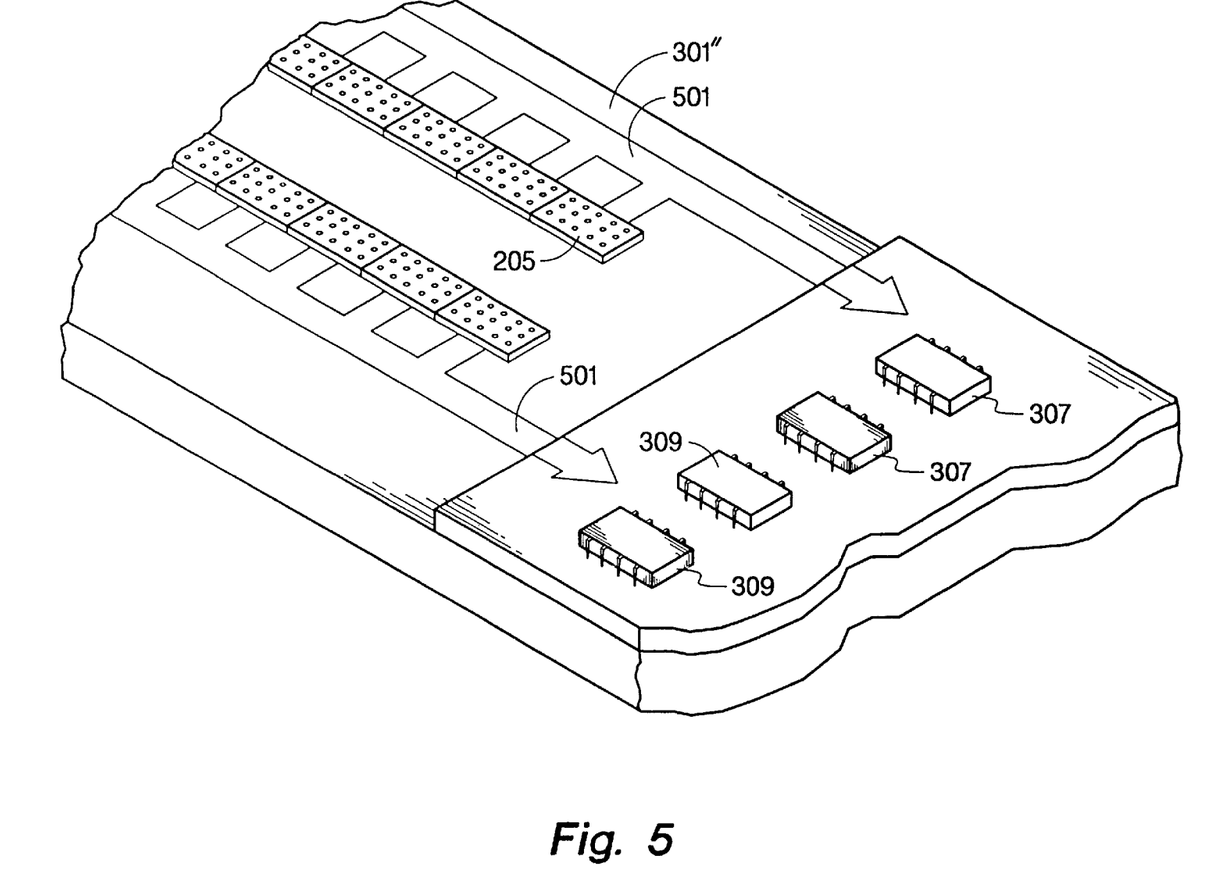
FIG. 5 illustrates an external surface of a printhead which may be employed in the present invention.

In an embodiment in which the ink ejectors are placed on a carrier substrate 301, 301' integrated circuits 307, 309 are mounted on the carrier substrate. These integrated circuits select which of the plurality of firing resistors 405 are to be activated to eject ink. One type of integrated circuit is a drive circuit, represented by integrated circuit 309, which supplies a given electrical drive signal to a given heater resistor in order to provide the needed heat energy to vaporize the ink. A logic circuit is represented by integrated circuit 307. As shown in FIGS. 3A and 3B, logic circuit 307 and drive circuit 309 are mounted to the inside surface of the carrier substrate 301, 301'. Alternatively, as shown in FIG. 5, the logic circuits 307 and drive circuits 309 are mounted to an outside surface of the substrate 301". The functions which may be undertaken by the integrated circuits 307 and 309 are similar to those described in U.S. Pat. No. 5,808,629. It should be understood that the integrated circuits which are employed in the present invention may be further integrated as semiconducting and metalization layers of the carrier substrate 301. The printhead includes electrical interconnects 501 which may be disposed on the external surface 303 or the internal surface 305 of the interconnect substrate 301, 301'. As shown in FIG. 5, the ink ejection assemblies are mounted to the surface of the substrate 301" in electrical contact with the respective electrical interconnect 501. The interconnect 501 extends to integrated circuits 307, 309 which source the drive electrical signals. During operation the printhead receives printer control signals from off of the carrier substrate. Such signals are received onto the substrate via a subsequent electrical interconnect.

Figure 6:
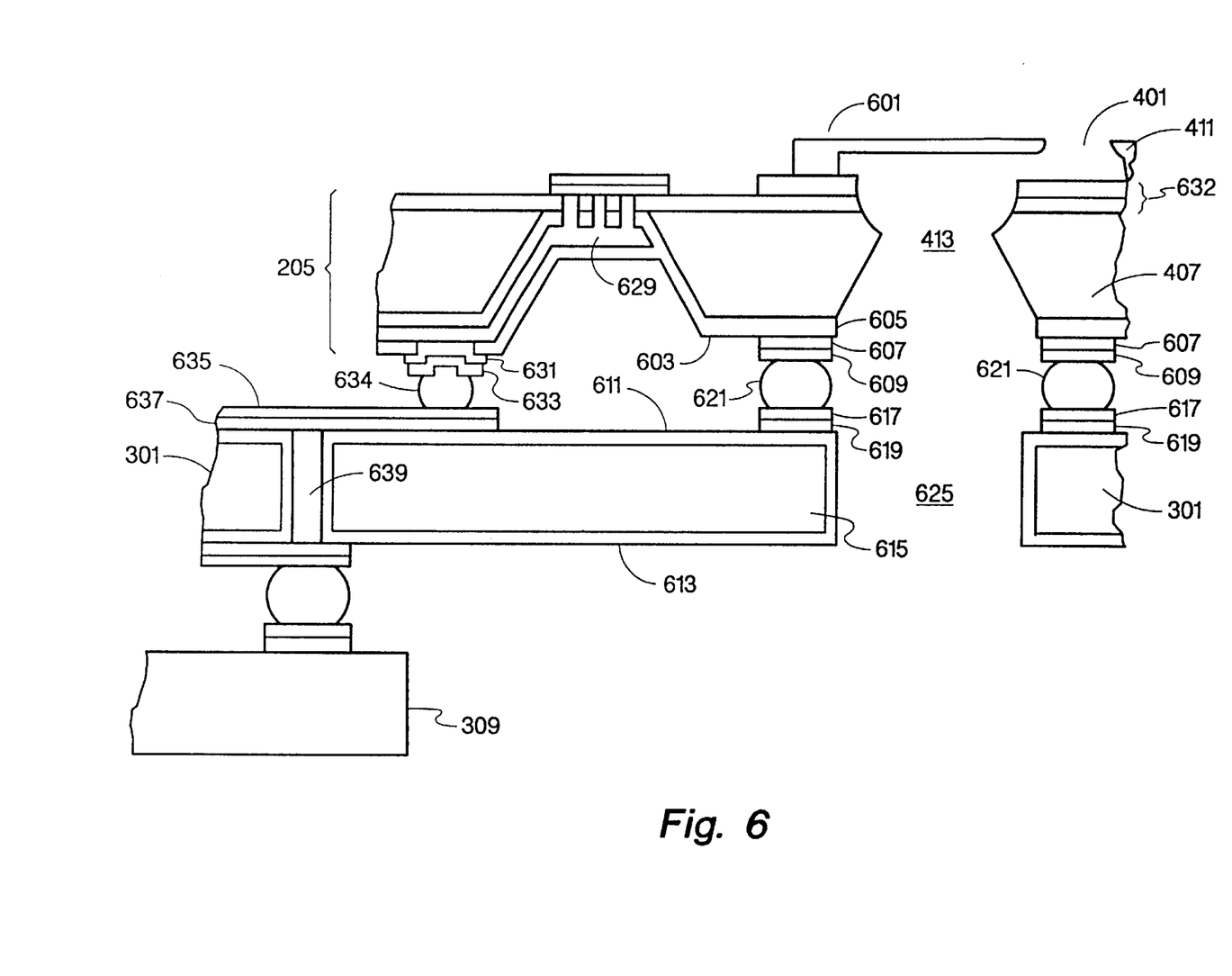
FIG. 6 illustrates a cross section through an ink ejection apparatus disposed on an external surface of a carrier substrate which may be employed in the present invention.

Referring now to FIG. 6, a combined cross section of an ink ejector apparatus 205 mounted on an external surface of the carrier substrate 301 is illustrated. The printhead has a print surface 601 which faces the medium to be printed upon and a second surface 603, opposite the first surface 601. Nozzle openings 401 occurs in the external surface 601 and the ink feed channel 413 is disposed in the second surface 603. The semiconductor substrate 407 has one or more dielectric layers 605 (e.g. nitride or carbide layers) at the second surface 603. During fabrication of one embodiment of the ink ejection apparatus, a pad comprising an electrically conducting interconnect metal 607 and a wetting material 609 (such as gold) are deposited onto the second surface 603 at prescribed locations. The interconnect metal is deposited onto the dielectric layers, and the wetting material is applied onto the interconnect metal. Photolithographic processes are used to define a precise location, size, and shape of the wetting material 609. Such processes enable accurate placement of the wetting metal to within one micron.

The carrier substrate 301 also includes a first surface 611 and a second surface 613 opposite the first surface 611. The ink ejection apparatus 205 is mounted to the carrier substrate 301 with the ink ejection apparatus second surface 603 facing the carrier substrate 301 first surface 611 as shown in FIG. 6. For clarity, the spacing between the ink ejection apparatus 205 and the carrier substrate 301 is exaggerated. Like the ink ejection apparatus 205 a dielectric layer 615 (e.g. nitride layer) is applied to the surfaces 611 and 613. An interconnect metal 617 and a wetting metal 619 are deposited onto the nitride dielectric layer 615 at prescribed locations. Photolithographic processes are also used to define a precise location, size, and shape of the wetting metal 619 on the carrier substrate. As mentioned earlier, such processes enable accurate placement of the wetting metal to within one micron. The wetting metals 619 on the carrier substrate 301 are formed in locations corresponding to the wetting metals 609 of the ink ejection apparatus 205. Specifically, there is a one-to-one correspondence between the wetting metal locations on the carrier substrate 301 and the ink ejection apparatus 205.

Solder balls 621 are deposited onto the wetting metal of either the ink ejection apparatus 205 or the carrier substrate 301. To mount an ink ejection apparatus 205, the ink ejection apparatus is aligned and mated to the carrier substrate 301 so that the corresponding wetting materials of each line up. It is expected that the initial alignment will be within 5 to 10 microns. The wetting metals 609 and 619 are separated by the solder ball 621. The assemblage and the solder are then heated to liquefy the solder. The solder flows along the wetting metals 609, 619 and the solder restoring force of the liquefied solder pulls the ink ejection apparatus 205 into precise alignment (i.e. approximately 1 to 2 microns) with the carrier substrate 301. More specifically the melted solder ball 621 pulls the printhead wetting metal 609 into precise alignment with the corresponding carrier substrate wetting metal 619 and establishes a defined gap between the two surfaces. Thus, it is by precisely locating the wetting metals 609, 619 using the photolithographic and other deposition processes that the ink ejection apparatus 205 are able to be precisely placed on the carrier substrate 301 within desired tolerances.

The solder, once solidified, also forms a fluid barrier. Since the ink ejection apparatus include one or more refill slots and the carrier substrate includes one or more refill channels 625. Each ink feed channel; 413 is to be in fluidic communication with a refill channel 625. As shown in FIG. 6 the ink feed channel 413 is aligned to the refill channel 625. To prevent ink from leaking at the interface between the ink ejection apparatus 205 and the carrier substrate 301, a fluid seal must be formed. When the solder used in the mounting process is corrosion resistant, it will serve as the fluid seal against the ink which is found in the ink feed channel 413 and the refill channel 625.

Figure 7:
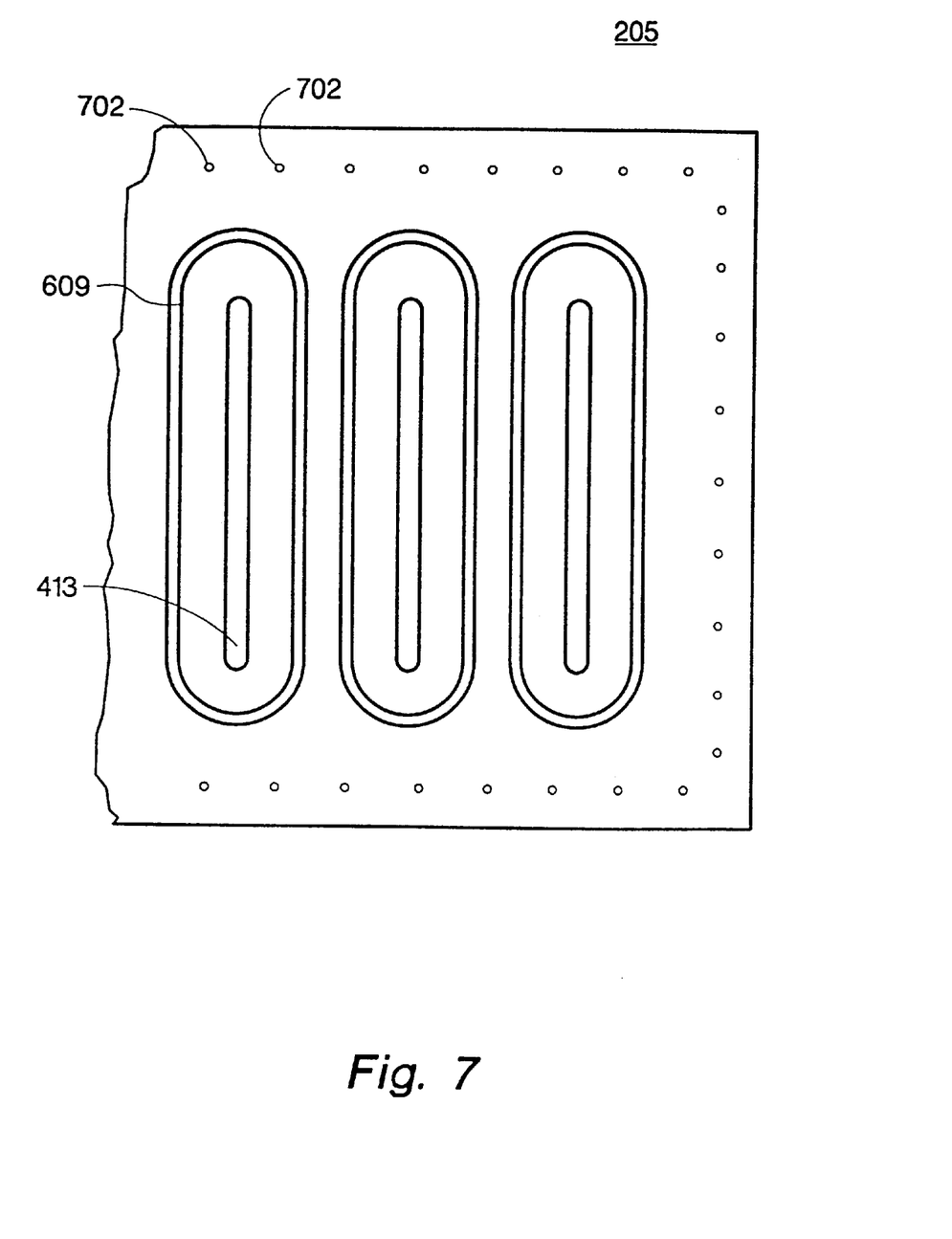
FIG. 7 is a plan view of the inside surface of an ink ejection apparatus which may be employed in the present invention.

A plan view of that part of the second surface 603 of the ink ejection apparatus 205 illustrating the ink feed channel 413 and the surrounding wetting material 609 pattern which produces the fluid seal is shown in FIG. 7. In this view, three ink refill slots are visible. When solder is melted to mount the ink ejection apparatus 205 to the substrate 301, the solder wets the surface of the entire ring of wetting material 609 and defines a seal or fluidic barrier which prevents ink from leaking at the interface between the ink ejection apparatus and the substrate 301.

Figure 8:
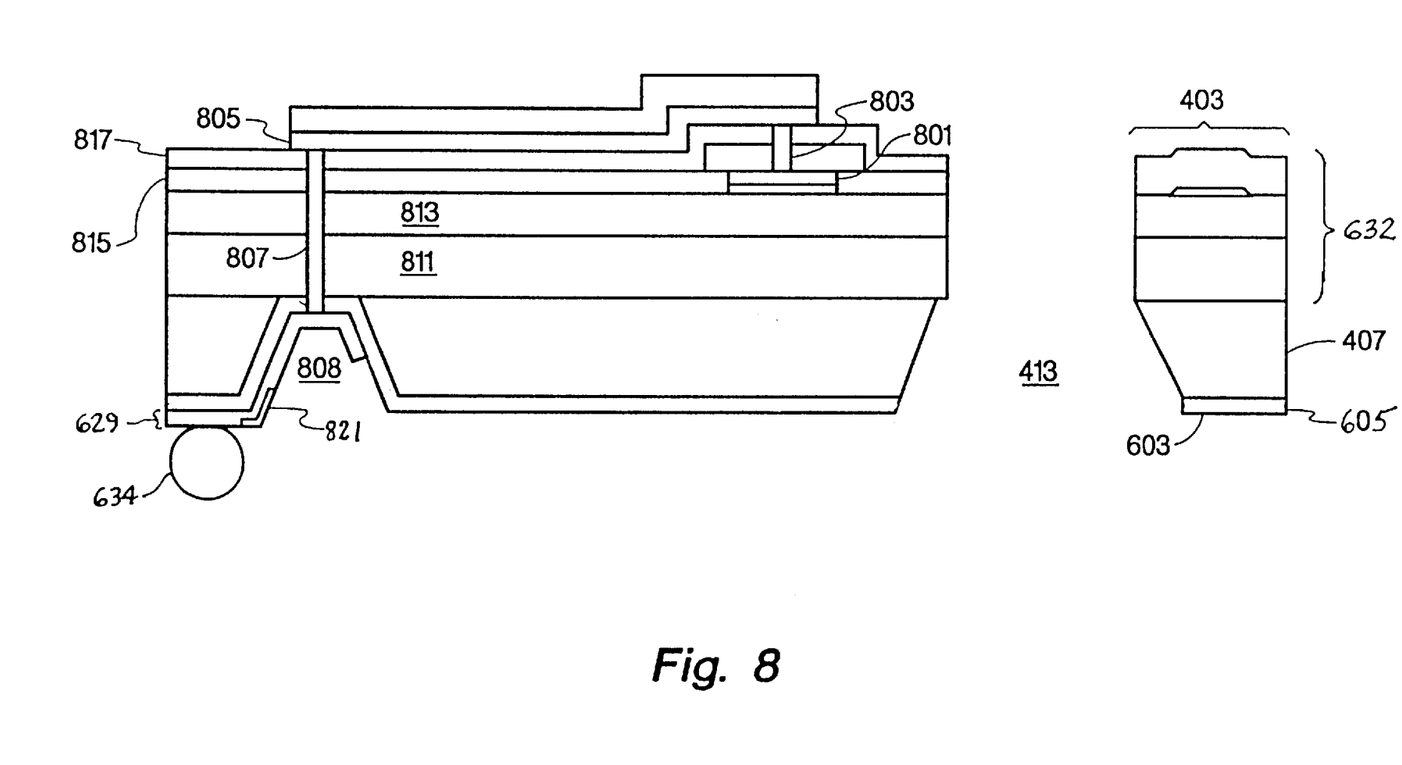
FIG. 8 is a cross section through the ink ejection apparatus of FIG. 6 and having particular emphasis on the conducting, insulating, and barrier layers disposed on the semiconductor substrate.

Because the carrier substrate 301 is adjacent to the second surface 603 of the ink ejection apparatus, an electrical interconnect is used to extend electrical connection from the first surface 601 to the second surface 603 of the ink ejection apparatus 205. FIG. 6 illustrates such an interconnection layer 629 extending from the surface of the thin-film structure 632 adjacent the first surface 601 through the silicon substrate 407 toward the second surface 603. Turning now to FIG. 8, a more detailed illustration of the electrical interconnection near the firing chamber 403 is shown in a cross section of the substrate and layers disposed thereon. An electrical connection extends from an electrically conducting wiring line 801 through a via 803 to a conductive trace 805 to a via 807 and the interconnect layer 629. The interconnect layer 629 then connects by way of a solder ball 634 interconnect to a carrier substrate (essentially as shown in FIG. 6).

In one embodiment of the present invention, the electrical interconnect for the semiconductor substrate is accomplished by the through-via as described above. Electrical conducting materials are disposed on both sides of the substrate and appropriate electrical connection is made through the substrate. One or more vias 807 are cut through the conventional passivation layers 811, 813, and 815 and a carbide layer 817 of the thin-film structure 632. The vias 807 extend from the interconnect layer 629 to the upper surface. A via 803 is also cut to expose a portion of a wiring line 801. Metal is then deposited in the vias 803 and 807. Next the conductive trace 805 is conventionally photolithographically patterned, and etched onto a layer of the thin-film structure 631 to electrically couple the wiring line 801 and the interconnect layer 629. A second dielectric layer (for example a nitride layer) is then deposited. A polyimide or electroplating photoresist process conventionally is used to mask this layer and form an opening in it to expose a portion of the interconnect layer 629.

To form the through-via interconnect, a trench 808 is etched or otherwise created in the second surface 603 of the semiconductor substrate 407 for one or more interconnects. Such an etching operation is performed with a tetramethyl ammonium hydroxide etch in one embodiment. A dielectric material 605, such as a carbide or nitride layer, covers portions of the semiconductor substrate 407 second surface 603 which are not etched. The hard mask is then removed by wet etching. A conductive layer 629 is deposited on the second surface as shown in FIG. 8. In one embodiment of the present invention, a photosensitive polyimide layer or an electroplating compatible photoresist is applied over a portion of the conducting layer 629 to define where the metal is to remain for the interconnect layer. The conducting layer 629 is then wet etched and the polyimide or photoresist is removed to define the interconnect layer 625.

In an alternative embodiment, which is visible in FIG. 8, the metal system that comprises the conducting layer 629 is first an adhesion layer, such as chromium or tantalum, to form a strong adherence to the dielectric material 605. A metal, such as nickel-vanadium, forms the bulk of the conducting layer 629 and is deposited atop the adhesion layer. An oxidation cap (for example, gold) is then layered over the nickel-vanadium. In this alternative embodiment, certain areas are not covered with the oxidation cap (for example, the gold is selectively removed). These areas are oxidized and are not wettable by solder. Thus, solder dams, such as solder dam 821, are formed in strategic locations to control the flow and location of solder.

To protect the conducting layer 625 during etching of the refill slot 413, a plasma oxide (not shown) is deposited. The plasma oxide and the carbide or nitride layer 605 are patterned to define a window through which the refill slot 413 is etched in the substrate.

Figure 9:
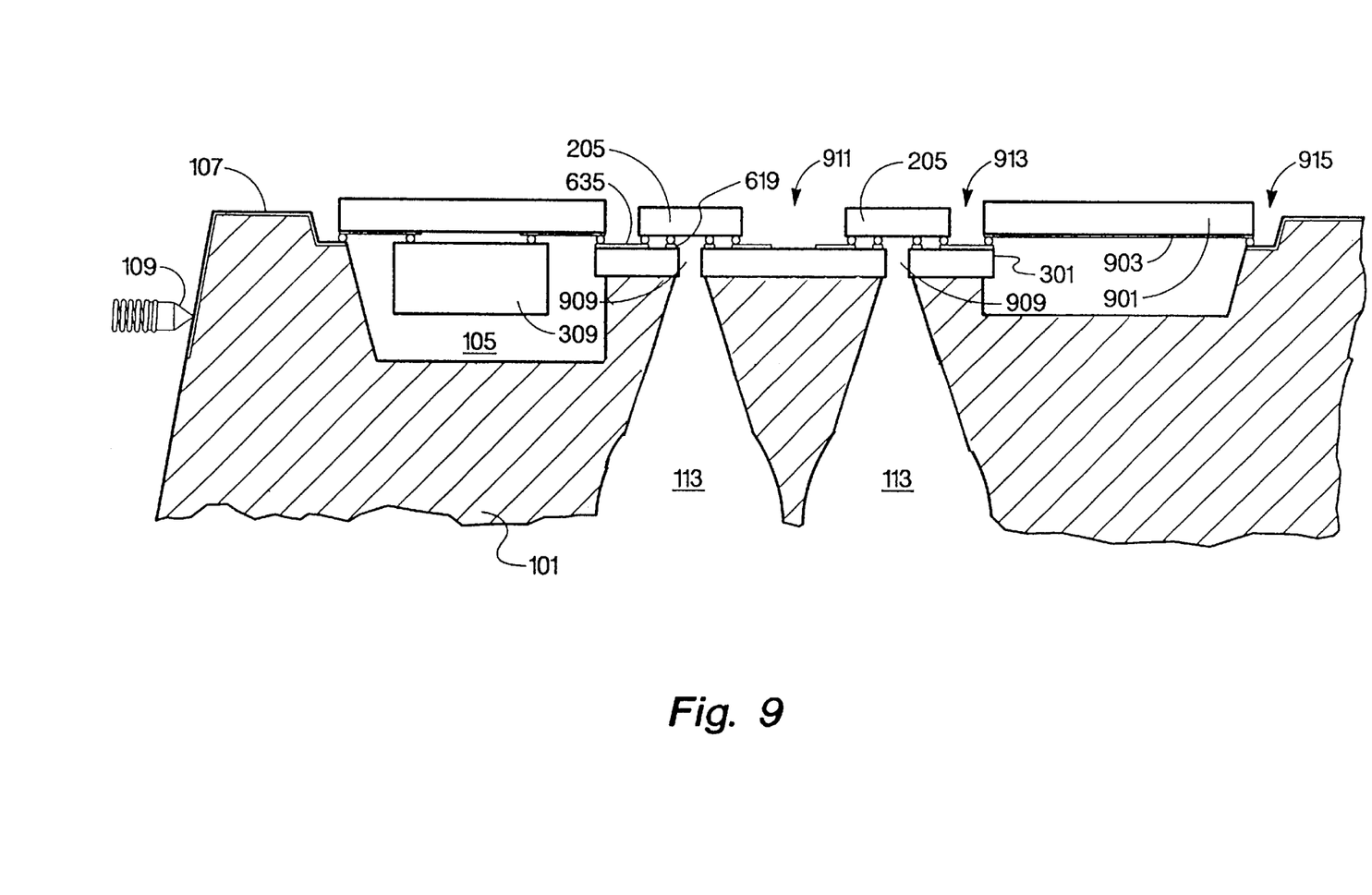
FIG. 9 is a cross section of the nose of the print cartridge illustrating one embodiment of a print cartridge which may include the present invention.

In an alternative embodiment of the present invention illustrating the mounting of the printhead to the cartridge body, the carrier substrate 301 is affixed to a circuit board 901 as shown in FIG. 9. Like the carrier substrate 301, circuit board 901 must exhibit a stiffness, a flatness, and a thermal coefficient of expansion compatible with silicon ink ejectors. Examples of such materials are silicon, ceramic, carbon, and glass. As illustrated in FIG. 9, ink ejectors 205 are soldered to a conductor, the wetting metal layer 619 of carrier substrate 301 as previously described. For clarity, details of the interconnect metal layer 617 and the wetting layer 619 have been omitted from the drawing of FIG. 9.

Returning to FIG. 7, interconnections are made from the second surface of the ink ejector apparatus 205 are shown as circular pads 702 corresponding to metal layer 633 and are placed as convenient around the periphery of the ink ejector apparatus. Balls of solder (not shown) are screened or otherwise deposited on both the circular pads 702 and the ring of wetting material 609 so that when the ink ejector apparatus 205 is pressed to the carrier substrate 301 and heated, the solder melts, the solder restoring force of the solder pulls the ink ejector apparatus 205 into alignment, and (upon the removal of heat and the solidification of the solder) both an electrical connection is made for contacts corresponding to layer 633 and a fluid seal is formed for the ring corresponding to 609. Alternatively, the solder balls may be applied to the carrier substrate 301 to which the ink ejection apparatus 205 is then pressed and heated.

As described previously, the ink ejector apparatus 205 is reflow soldered to the carrier substrate 301 such that an electrical connection is achieved to interconnect metal 617 and wetting metal layer 635 and a fluid seal is achieved to metal 619 of carrier substrate 301. With the selection of a lower melting temperature solder the carrier substrate 301 with a plurality of ink ejector apparatus 205 attached, can itself be attached to circuit board 901 as shown. (It is desirable that solders of increasingly higher melting points be used in the construction of a printhead. For example, soldering of an integrated circuit to a carrier substrate would use a gold-tin solder while the solder used in the ink ejector would use a silver-tin alloy and the solder used in the assembly to the cartridge body would use a bismuth-tin alloy). A metalization layer 903 is disposed on an inside surface of circuit board 901 so that electrical and physical connection may be made to carrier substrate 301. Metalization layer 903 is appropriately patterned so that electrical connection can be accomplished between the carrier substrate 301 and the rest of the print cartridge body 101 (by way of a TAB circuit 107 or an equivalent metalization layer) and subsequent connection to the printer by way of interconnect contact 109. Metalization layer 903 also provides registration of the entire assembly (in a first embodiment consisting of the print ejectors 205, the carrier substrate 301, and the circuit board 901) with alignment produced by the solder restoring force of melted solder when the circuit board 901 is affixed by soldering to the print cartridge body 101. The TAB circuit 107 or the metalization layer also may be patterned to allow electrical interconnection of control and driver integrated circuits, illustrated as integrated circuit 309 in FIG. 9.

In order to provide for ink supply to the ink ejector apparatus 205, ink ducts 113 are created in the ink cartridge body 101 to direct ink to the printhead. In an alternative embodiment, the printhead may be mounted on an ink manifold apparatus which may be coupled to an ink source by tubes or other fluid directing devices. In either embodiment, the carrier substrate 301 is affixed to the mechanism containing the ink ducts 113 on a surface opposite the surface to which ink ejector apparatus 205 is soldered. As shown, the ink ducts 113 match an opening 909 in the carrier substrate 301 (which is previously created by abrasive or etching techniques). Opening 909, of course, is aligned with ink feed channel 413 (as shown in FIGS. 4 and 6, but not shown in FIG. 9) so that ink may be supplied to each firing chamber of the ink ejection apparatus 205. Once the circuit board 901 is disposed in the well 105 provided in print cartridge body 101, the ink ducts 113 are aligned to the printhead and secured to the print cartridge body 101 with the application of heat.

Ink which is formulated for inkjet printing is provided certain characteristics which are highly advantageous to the rapid drying and the prevention of ink bleed and smear on the medium to be printed upon. These same characteristics introduce problems for printheads. For example, the advantage of rapid drying on a medium yields undesired deposits of dried ink on the printhead. Further, ink can corrode metals and materials used in printheads as well as produce electrical short circuits when ink bridges some electrical contacts. Ink is conventionally prevented from coming into contact with sensitive materials or electrical circuits. In order to prevent ink from entering openings in the printhead, where it is undesirable for ink to be (such as the gap 911 between the ink ejection apparatus 205, or the gap 913 between an ink ejection apparatus 205 and the circuit board 901, or the gap 915 between circuit board 901 and the print cartridge body 101). An encapsulant, such as an epoxy, is applied in each of these gaps in order to prevent the ink from entering undesired spaces. Printers are provided with a specialized mechanism, commonly known as a service station, to periodically clean the surface of a printhead by physically wiping, among other procedures, to remove puddled and dried ink from the printhead surface. In order to improve the effectiveness of this wiping procedure, it is desirable to have the nozzle plate 411 of the ink ejector apparatus 205 be elevated above, or at least flush with other surfaces of the printhead. Furthermore, it is desirable to reduce or eliminate the number of crevasses and cracks in the surface to be wiped so as to reduce the number of areas available for dried ink to accumulate.

In this embodiment of the present invention, the circuit board 901 is approximately 1015 microns (40 mils) thick. The ink ejection apparatus 205 is approximately 660 microns (26 mils) thick.

Figure 10:
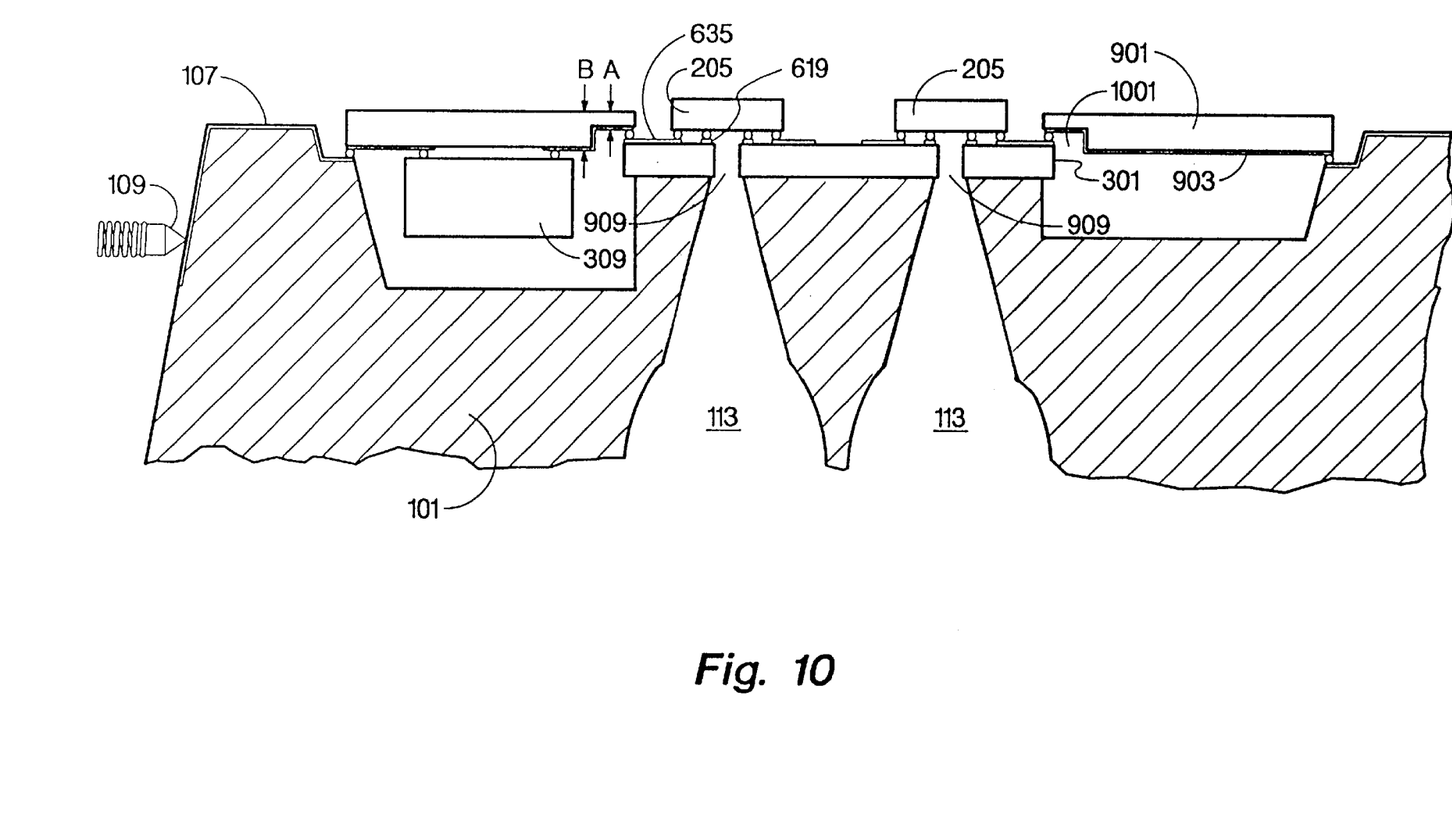
FIG. 10 is a cross section of the nose of the print cartridge illustrating another embodiment of a print cartridge which may include the present invention.

A second alternative embodiment of printhead mounting is illustrated in FIG. 10. In this embodiment, the circuit board 901 is provided a reduced thickness notch 1001 in the slot provided for the mounting of the carrier substrate 301. This thinner notch is produced in circuit board 901 by selective etch or other similar techniques. In this second alternative embodiment, the thickness shown in FIG. 10 as "A" equals a thickness of approximately 635 microns (25 mils). Such a circuit thickness, if used throughout the printhead area, would not have sufficient strength or stiffness for reliable inkjet printing use. Accordingly, a thicker circuit board, having a thickness of approximately 1525 microns (60 mils) at location "B" is employed. When used with an ink ejection apparatus 205 having a thickness of approximately 660 microns (26 mils), the nozzle plate 411 of the ink ejection apparatus 205 stands proud of the surface of the circuit board 901 and facilitates improved printhead wiping and cleaning.

Figure 11:
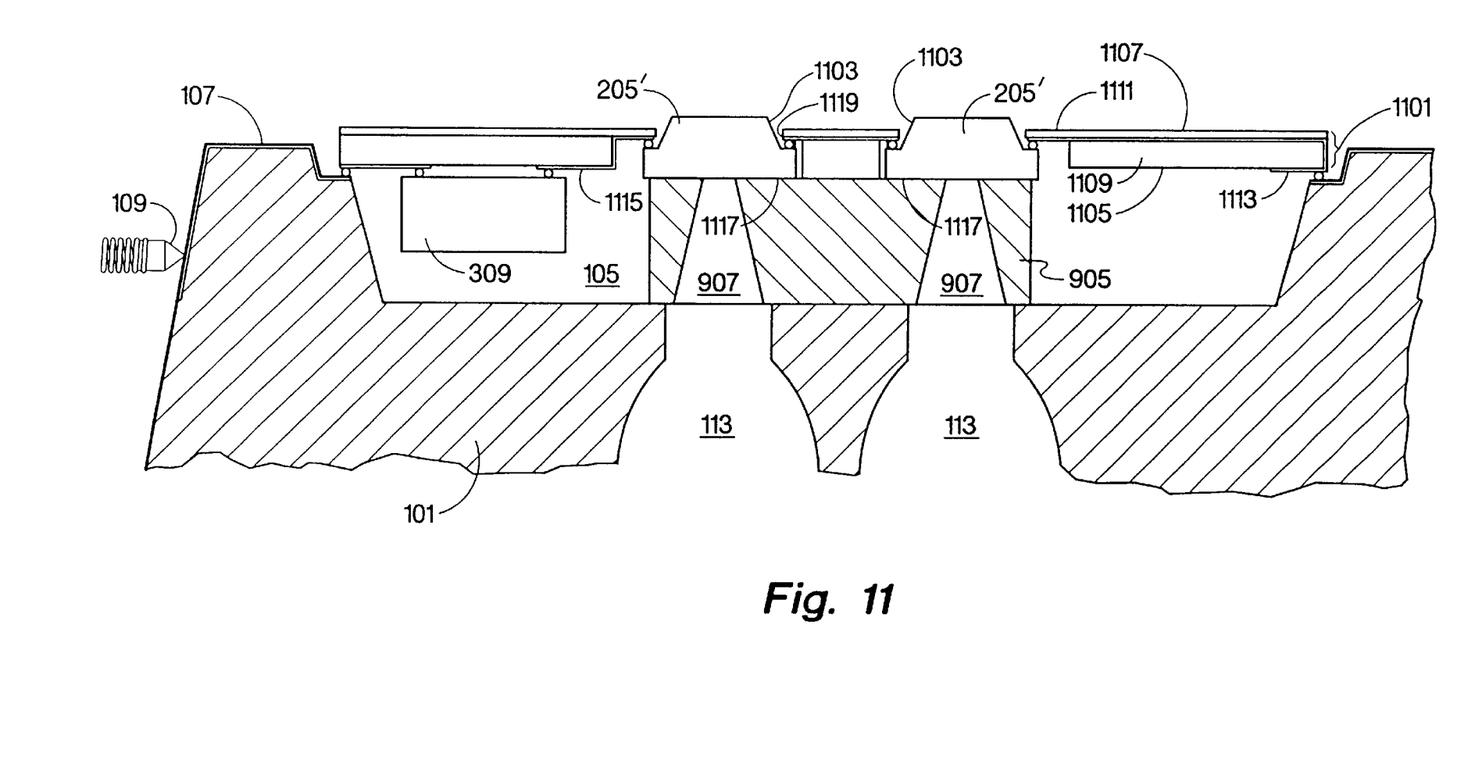
FIG. 11 is a cross section of the nose of the print cartridge illustrating another embodiment of a print cartridge which may include the present invention.

A third alternative embodiment of printhead mounting is illustrated in FIG. 11. In this embodiment the plurality of ink ejection apparatus 205' are reflow solder mounted to a substrate 1101 which performs the functions of both the carrier substrate 301 and the circuit board 901. An advantage of this embodiment is that the external surface 1103 of the ink ejection apparatus 205' is attached to the second, inside, surface 1105 of the substrate 1101. Such an attachment eliminates the need for electrical vias through the semiconductor substrate of the ink ejection apparatus. Electrical connections are disposed on the external surface 1103 of the ink ejection apparatus and, in one embodiment of the preferred invention, on a shoulder 417 of the external surface 1103 which is recessed from the nozzle plate 411. This orientation enables the surface of the nozzle plate to protrude above the external surface 1107 of the substrate 1101 so that wiping of the printhead will result in an effective cleaning of the nozzle plate without deposition of dried ink on an otherwise recessed ink ejection apparatus.

The substrate 1101, in order that the ink ejection apparatus 205' protrude from the external surface 1107, must be thinner than the thickness of the ink ejection apparatus 205'. As described before, the substrate can be formed from a single piece of rigid material which is subsequently worked to provide openings and reduced thickness areas. It is a feature of this embodiment of the present invention that substrate 1101 be formed from two layers of rigid material. An external, or thin, layer 1111 is made thin to minimize the recess dimension (height of the nozzle plate 411 surface above the shoulder 417) in the ink ejection apparatus 205'. The thin layer 1111 is preferably constructed of ceramic and forms the external surface 1107 of the substrate 1101. A thickness for the thin layer can be as thin as 50 microns, so long as the layer provides adequate stiffness for convenient handling during fabrication and proper attachment to a thick layer 1109. The thickness of the thin layer 1111 and the solder ball attaching the ink ejection apparatus 205' to the thin layer 1111 (for example solder ball 1119), after reflow, must be less than the recess dimension. The opening in the thin layer 1111 can be formed by punching or molding the ceramic in the green state and laser machining or mechanically abrading the ceramic in the fully sintered state. As illustrated in FIG. 11, a thick layer 1109 of material provides the necessary rigidity and strength for the laminated substrate 1101 and forms the second, inside, surface 1105 of the substrate 1101.

Typical ceramics for the thin layer 1111 and the thick layer 1109 are conventional circuit board materials such as alumina or zirconia. Alternatively, the material for the thick layer 1109 can be a polymer/fiber composite used for printed circuit boards and having a coefficient of thermal expansion matched to the thin layer 1111. It is important that the external surface 1107 be sufficiently smooth to not abrade the contacting surface of the device used to clean and maintain the printhead.

Electrical interconnection is provided between the ink ejection apparatus 205' and other components, such as other ink ejection apparatus, integrated circuits 309, and the print cartridge body 101 metalization layer 107, by way of a conducting layer 1113 disposed on and in the substrate 1101. It is a feature of this embodiment of the present invention that the conducting layer is disposed between the thick layer 1109 and the thin layer 1111 in addition to being disposed on other surfaces of either layer. Electrical connection to the ink ejection apparatus 205' is accomplished by solder ball reflow solder attachment of the ink ejection apparatus through a conducting layer disposed on the thin layer 1111. This conducting layer is then selectively routed to the other components by conventional selective deposition or removal techniques. As previously discussed, the reflow process yields ink ejection apparatus registration with a precision of about ±1 micron. A conducting layer may also be disposed on surfaces of the thick layer 1109 and patterned to provide appropriate electrical interconnection. The conducting layer on the thick layer 1109 is preferably aligned with the conducting layer on the thin layer 1111 such that the two layers become joined partial layers of the conductive layer 1113. The two partial layers are joined with conventional conductive adhesives. This arrangement enables the partial layer disposed on the thick layer 1109 to be patterned onto other sides of the thick layer and be reflow soldered to the metalization layer 107 of the cartridge body 101. As an alternative, a simpler conductive layer 1115 may be produced after the thick layer 1109 and the thin layer 1111 are conventionally secured together. A conductive layer is disposed on the inside surface 1105 (which, of course, has two essentially parallel levels corresponding to the thick and thin layers) of the laminate substrate 1101 as well as appropriate edges of the substrate 1101 by conventional deposition or removal techniques.

Complex electronic devices, such as integrated circuit 309 and integrated circuit 307 (not shown in FIG. 11), are expected to be mounted to the inside surface 1105 of the substrate 1101 and interconnected to the ink ejection apparatus 205' by way of the conducting layer 1113 and/or 1115. It should be noted that passive, less complex, components such as capacitors may also be mounted to the substrate 1101. A liquid tight seal is formed to the cartridge body 101 by the inside surface 1117 of the ink ejection apparatus 205' so that ink will not escape from the ink ducts 113 coupled to the ink feed channels 413 of the printhead.

Figure 12:
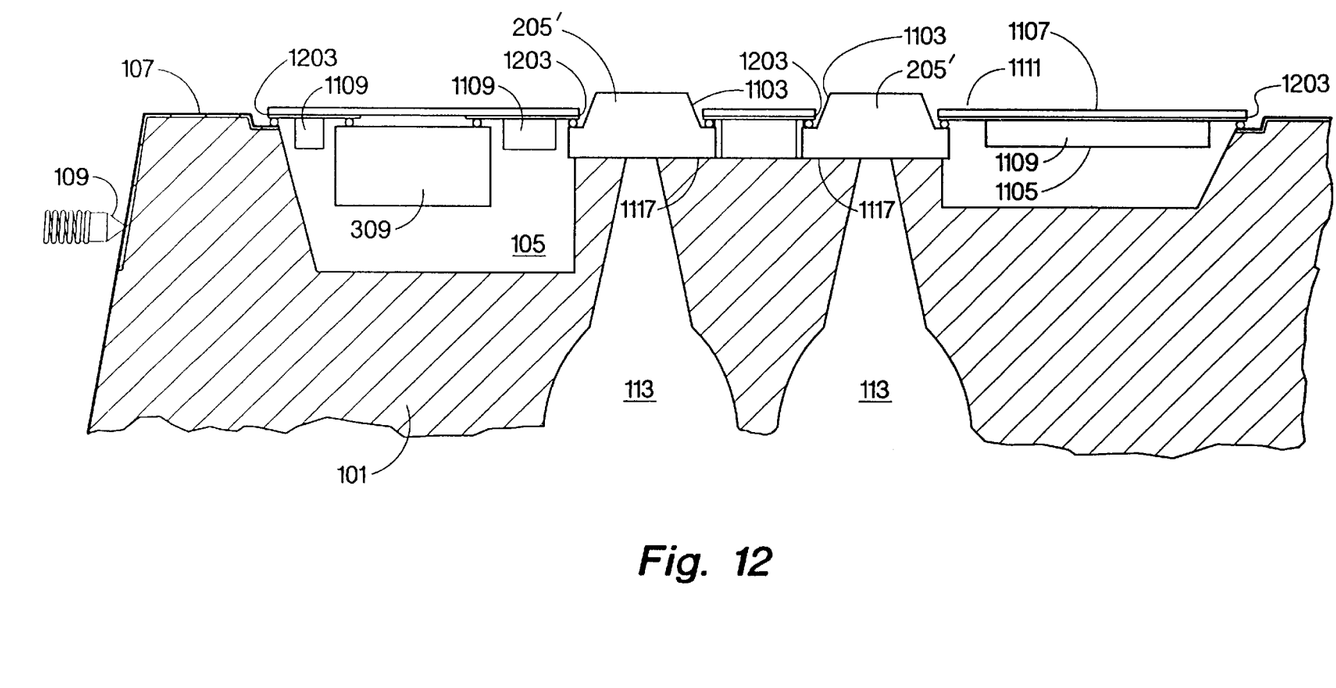
FIG. 12 is a cross section of the nose of the print cartridge illustrating another embodiment of a print cartridge which may include the present invention.

A fourth alternative embodiment of the present invention relating to the mounting of the printhead, shown in FIG. 12, employs a laminate substrate 1101 in which the conductive layer 1203 is disposed between the thin layer 1111 and the thick layer 1109. This construction allows a simple metalization layer to be patterned and placed on the thin layer 1111 without the additional steps necessary for bringing the conductive layer to other surfaces of the thick layer 1109. The thin layer 1111 is then secured and connected to the cartridge body 101 by way of the conductive layer 1203 and solder reflow techniques. The spaces between the thick layer 1109 and each ink ejector 205' can be underfilled with epoxy to provide additional strength in these areas. Likewise, the junction between the thin layer 1111 and the cartridge body 101 can be filled with epoxy for strength and ink impermeability.

Once the printhead (including substrate, ink ejection apparatus, and electronic components) is assembled, solder balls are deposited on the conducting layers 1113, 1115, and 1203 in locations determined by a corresponding location of the metalization layer 107, and the printhead is placed in the well 105 of the print cartridge body 101. The metalization layer 107 is patterned to provide mounting pads for the patterned conducting layers. As appropriate, additional metal, wetting, and oxidation cap layers may be placed on the metalization layer 107 or the conducting layers 1113, 1115, and 1203. The assembly is heated so that the solder balls melt and, as a result of the solder restoring force of the liquid solder, locate the printhead in its predetermined place on the print cartridge.

Accordingly, a printhead employing a plurality of ink ejection apparatus is arranged in a wide array configuration having close tolerances. Using well patterned electrical conductors on the ink ejection apparatus and on the mounting substrate provides a reliable electrical interconnect as well as a high degree of registration between the ink ejection apparatus on the printhead. The inventive assembly produces a reliable wide array printhead with improved quality of printing.

We claim:

1. A method of manufacturing a printhead comprising the steps of:

laminating first and second laminations to form an essentially rigid substrate, said first lamination being thinner than said second lamination and having a first side of said first lamination forming an external surface of said essentially rigid substrate, said second lamination being affixed to a second side of said first lamination; providing an opening in said essentially rigid substrate, said opening extending from said external surface to a second surface of said essentially rigid substrate;

disposing a conducting layer at least partially on said second side;

forming an ink ejection assembly including an ejector, a nozzle plate and an ink feed channel, further comprising the steps of forming a nozzle in said nozzle plate, disposing said nozzle plate on a portion of an external surface of said ink ejection assembly, disposing an ejector in association with said nozzle such that ink is ejected from said nozzle when said ejector is energized, disposing a conducting layer on a second portion of said external surface of said ink ejection assembly and coupling said conducting layer to said ejector whereby said ejector is energized, and opening an ink feed channel in an inside surface of said ink ejection assembly;

disposing said ink ejection assembly in said opening and in contact with said essentially rigid substrate such that said nozzle plate and said external surface of said essentially rigid substrate are in a predetermined relationship relative to one another and said conducting layer of said ink ejection assembly is connected to said conducting layer of said essentially rigid substrate; and wherein said opening includes a first magnitude of area in said first lamination and a second magnitude of area in said second lamination, said second area magnitude being larger than said first area magnitude, whereby said opening is smaller at said first surface of said essentially rigid substrate than at said second surface of said essentially rigid substrate.

2. A method in accordance with the method of claim 1 wherein said ink ejection assembly disposing step further comprises the step of disposing said nozzle plate and said external surface of said essentially rigid substrate in an essentially coplanar relationship.

3. A method in accordance with the method of claim 1 wherein said ink ejection assembly disposing step further comprises the step of extending said nozzle plate though and from said opening beyond said external surface of said essentially rigid substrate.

4. A method in accordance with the method of claim 1 wherein said step of laminating further comprises the step of disposing said first lamination next to and at least partially surrounding said opening, and closer to said first surface of said essentially rigid substrate than said second lamination, thereby producing a thinner essentially rigid substrate in an area defined by said first lamination than in an area defined by said second lamination.

5. A method in accordance with the method of claim 4 further comprising the step of connecting said conducting layer of said ink ejector assembly to said conducting layer disposed on said second side.

6. A printhead in accordance with claim 1 further comprising an active electronic circuit disposed on said second surface of said essentially rigid substrate and coupled to said conducting layer of said second side.

7. A printhead in accordance with claim 1 wherein said ink ejection assembly further comprises an ink distribution layer affixed to said second surface of said ink ejection assembly and fluidically coupled to said ink feed channel, whereby ink may be provided to said ejector.

8. A method of manufacture of a fluid ejecting apparatus comprising the steps of:

laminating first and second laminations to form a laminated substrate with first and second surfaces, said first lamination being thinner than said second lamination and having a first side of said first lamination forming said first surface of said laminated substrate and a second side of said first lamination to which said second lamination is laminated;

extending at least one opening from said first surface to said second surface, said at least one opening having a first magnitude of area in said first lamination and a second magnitude of area in said second lamination, said second area magnitude being larger than said first area magnitude, whereby said opening is smaller at said first surface of said laminated substrate than at said second surface of said laminated substrate;

disposing a conducting layer at least partially on said second side; and disposing a fluid ejection assembly in said at least one opening and in contact with said laminated substrate such that said second conducting layer is in electrical connection with said conducting layer.

9. A method in accordance with the method of claim 8 wherein said step of disposing said fluid ejection assembly further comprises the step of orienting said fluid ejection assembly such that said ink ejection assembly surface and said first surface of said laminated substrate are in a predetermined relationship relative to one another.

10. A method in accordance with the method of claim 9 wherein said step of orienting further comprises the step of orienting said fluid ejection assembly surface and said first surface of said laminated substrate in an essentially coplanar alignment.

11. A method in accordance with the method of claim 8 further comprising the steps of disposing an electronic circuit on said second surface of said laminated substrate and electrically coupling said electric circuit to said conducting layer.

* * * * *